(12) United States Patent
Bayerer

(10) Patent No.: US 7,449,801 B2
(45) Date of Patent: Nov. 11, 2008

(54) SEMICONDUCTOR CIRCUIT ARRANGEMENT FOR CONTROLLING A HIGH VOLTAGE OR A CURRENT OF HIGH CURRENT INTENSITY

(75) Inventor: Reinhold Bayerer, Warstein (DE)

(73) Assignee: Infineon Technologies AG (DE)

( * ) Notice: Subject to any disclaimer, the term of this patent is extended or adjusted under 35 U.S.C. 154(b) by 81 days.

(21) Appl. No.: 10/994,912

(22) Filed: Nov. 22, 2004

(65) Prior Publication Data

US 2005/0083097 A1 Apr. 21, 2005

Related U.S. Application Data

(63) Continuation of application No. PCT/EP03/11757, filed on Oct. 23, 2003.

(30) Foreign Application Priority Data

Nov. 28, 2002 (DE) ................. 102 55 602

(51) Int. Cl.
*H01H 79/00* (2006.01)
(52) U.S. Cl. ..................................... 307/135
(58) Field of Classification Search .................. 307/135
See application file for complete search history.

(56) References Cited

U.S. PATENT DOCUMENTS

| 4,893,070 | A | * | 1/1990 | Milberger et al. ............ 323/270 |
| 5,444,610 | A | * | 8/1995 | Gaudreau et al. ............. 363/54 |
| 5,760,464 | A | * | 6/1998 | Suyama et al. ............... 257/665 |
| 5,768,117 | A | * | 6/1998 | Takahashi et al. ............. 363/65 |
| 5,969,514 | A | * | 10/1999 | Merrill ........................ 323/283 |
| 6,043,636 | A | * | 3/2000 | Gaudreau et al. ............ 323/282 |
| 6,246,598 | B1 | * | 6/2001 | Tarter et al. ............... 363/56.01 |
| 6,351,359 | B1 | * | 2/2002 | Jæger ........................ 361/93.9 |
| 6,356,423 | B1 | * | 3/2002 | Hastings et al. ............. 361/93.2 |
| 6,590,757 | B2 | * | 7/2003 | Pahl et al. ................... 361/93.2 |
| 6,611,443 | B2 | * | 8/2003 | Gaudreau .................... 363/125 |
| 6,703,874 | B2 | * | 3/2004 | Katoh et al. ................. 327/108 |
| 6,713,991 | B1 | * | 3/2004 | McCallum ................... 323/226 |
| 6,900,557 | B1 | * | 5/2005 | Gaudreau et al. ............ 307/113 |
| 7,062,359 | B2 | * | 6/2006 | Bjorklund .................... 700/286 |
| 2003/0156437 | A1 | * | 8/2003 | Gruening ..................... 363/65 |
| 2004/0085117 | A1 | * | 5/2004 | Melbert et al. .............. 327/432 |
| 2004/0239298 | A1 | * | 12/2004 | Norrga et al. ................ 323/282 |

FOREIGN PATENT DOCUMENTS

| EP | 0 227 407 A2 | 12/1986 |
| EP | 0 785 625 A2 | 12/1996 |
| EP | 0 884 665 A1 | 6/1998 |
| GB | 2 172 161 | 9/1986 |
| JP | 62-141961 | 6/1987 |
| JP | 62-141962 | 6/1987 |
| JP | 05-259854 | 10/1993 |
| JP | 09-331668 | 12/1997 |
| JP | 2002-095240 | 3/2002 |

* cited by examiner

*Primary Examiner*—Michael J Sherry
*Assistant Examiner*—Adi Amrany
(74) *Attorney, Agent, or Firm*—Coats & Bennett, P.L.L.C.

(57) ABSTRACT

In the case of a semiconductor circuit arrangement for controlling a high voltage with a series circuit of semiconductor modules, the high voltage possibly being dropped between the ends of the series circuit, increased functional reliability is achieved by each semiconductor module having a parallel circuit of at least two components, at least one first component of which can be conducting or blocking, during normal operation, for that partial voltage of the high voltage which is applied to it, by the remaining component(s) of a parallel circuit blocking, during normal operation, at least when the first component blocks, and by each semiconductor module being set up in such a manner that, in the event of a functional disturbance in the first component, the remaining component(s) permanently change(s) into a conducting state.

20 Claims, 3 Drawing Sheets

SEMICONDUCTOR CIRCUIT ARRANGEMENT FOR CONTROLLING A HIGH VOLTAGE OR A CURRENT OF HIGH CURRENT INTENSITY

CROSS REFERENCE TO RELATED APPLICATION

This application is a continuation of copending International Application No. PCT/EP03/11757 filed Oct. 23, 2003 which designates the United States, and claims priority to German application no. 102 55 602.4 filed Nov. 28, 2002.

TECHNICAL FIELD OF THE INVENTION

The invention relates to a semiconductor circuit arrangement for controlling a high voltage with a series circuit of semiconductor modules, the high voltage possibly being dropped between the ends of the series circuit.

In addition, the invention relates to a semiconductor circuit arrangement for controlling a current of high current intensity with a parallel circuit of semiconductor modules which each carry partial currents.

BACKGROUND OF THE INVENTION

The invention is used in technical fields in which power semiconductors are used to control high voltages, typically at least several thousand volts, or high currents, typically at least several hundred amperes. This is the case, for example, in the field of power supply.

Switches for high voltages are usually in the form of mechanical switches in which two contacts are isolated from one another by moving at least one contact with generation of a spark or an arc. This requires the design and construction of a switch drive and also energy stores, catches and controllers for the drive and arc-resistant switching contacts.

The structural outlay for switches of this type may, in principle, be considerably reduced by using semiconductor elements.

However, it is difficult to use power semiconductors in high power ranges on account of the limited dielectric strength and current-carrying strength.

For this reason, switches for switching high voltages are formed from components which are electrically connected in series. Switches of this type are used, for example, for high-voltage DC transmission where AC voltages of several hundred kilovolts (kV) are rectified using semiconductors and are converted to AC voltage again at the end of a long transmission path. On the one hand, this minimizes the resistive power loss by virtue of the use of a high voltage and, on the other hand, keeps the dielectric loss (as a result of capacitive and inductive loads) low by virtue of rectification.

Since a relatively large number of semiconductor components are used in series circuits of this type, the failure of individual components during operation must be expected. It is therefore customary, in a series circuit of this type, to arrange more components than would be required to achieve the requisite dielectric strength. The individual components are embodied in such a manner that, in the case of a functional disturbance, they reliably change into a permanently conducting state and the redundancy is such that, in total, the remaining functioning semiconductors have the requisite dielectric strength.

This function of a component changing into a reliably conducting state in the case of failure or a functional disturbance has hitherto been achieved by using pressure-contact designs in the form of disk-type thyristors (presspack, hockey puck). This is known, for example, for thyristors and diodes. In the event of a breakdown of the silicon chip, this achieves a short circuit between the solid electrode plates which are pressed onto both sides of the silicon chip. The short circuit is produced by fusing of the respective silicon chip.

The design in presspack housings is also known for IGBTs (IGBT=Insulated Gate Bipolar Transistor). However, the MOS structures (MOS=Metal Oxide Semiconductor) on the top side of the chip of IGBTs give rise to technological disadvantages. The fabrication methods for IGBTs in presspack housings are therefore very complicated and expensive.

In order to control currents of high current intensity, it is also conceivable to provide a parallel circuit of semiconductor modules which each carry partial currents. In this case, when a semiconductor module becomes conductive as a result of a functional disturbance, this results in the entire parallel circuit and thus the semiconductor circuit arrangement becoming conductive for the current. In this case, it is thus not possible to operate with a component in the form of a presspack but rather, in the event of a functional disturbance, it must be ensured that the semiconductor module is isolated from the circuit arrangement or at least from the current path.

Against the background described, the object on which the present invention is based is to ensure that, in the case of a semiconductor circuit arrangement for controlling a high voltage and in the case of a semiconductor circuit arrangement for controlling a current of high current intensity of the type mentioned initially, the circuit arrangement is guaranteed to function even in the case of a functional disturbance in, or the failure of, individual semiconductor modules.

SUMMARY OF THE INVENTION

The object can be achieved by means of a semiconductor circuit arrangement for controlling a high voltage comprising a series circuit of semiconductor modules, wherein the high voltage may drop between the ends of the series circuit, wherein each semiconductor module comprises a parallel circuit of at least two components, at least one first component of which can be conducting or blocking, during normal operation, for that partial voltage of the high voltage which is applied to it, wherein the remaining component(s) of a parallel circuit block(s), during normal operation, at least when the first component blocks, and wherein each semiconductor module is set up in such a manner that, in the event of a functional disturbance in the first component, the remaining component(s) permanently change(s) into a conducting state.

The object can also be achieved by a semiconductor circuit arrangement for controlling a current of high current intensity comprising a parallel circuit of semiconductor modules which each carry partial currents, wherein each semiconductor module comprises a series circuit of at least two components, at least one first component of which can be conducting or blocking, during normal operation, for the voltage that is applied to it, wherein the remaining component(s) of the respective series circuit conduct(s), during normal operation, at least when the first component conducts, and wherein each semiconductor module is set up in such a manner that, in the event of a functional disturbance in the first component, the remaining component(s) permanently change(s) into a blocking state.

A voltage sensor for measuring the voltage that is dropped can be provided at least for the first component. A current sensor for measuring the current that is flowing through can be provided at least for the first component. A sensor for monitoring a control input can be provided at least for the first component. The lead of a control input may have a fuse and/or a current limiter. A current limiter can be formed by a bonding wire, which fuses when there is an overload, as the lead of the control input. The components can be in the form of thyristors. The components can also be in the form of IGBTs. At least two sensors from the following group of sensors: voltage sensor, current sensor, sensor for monitoring a control input, can be provided, and the control device may process the signals from the sensors in order to detect a disturbance state. At least one sensor can be provided in each semiconductor module, the control device checking disturbance-free functioning by means of the sensor and, in the event of a functional disturbance in a component, driving at least one other component of the same semiconductor module in such a manner that the semiconductor module as a whole is changed into a defined conducting state or a defined blocking state.

In the case of a semiconductor circuit arrangement for controlling a high voltage, the object can be achieved by each semiconductor module having a parallel circuit of at least two components, at least one first component of which can be conducting or blocking, during normal operation, for that partial voltage of the high voltage which is applied to it, by the remaining component(s) of a parallel circuit blocking, during normal operation, at least when the first component blocks, and by each semiconductor module being set up in such a manner that, in the event of a functional disturbance in the first component, the remaining component(s) permanently change(s) into a conducting state.

If the requirement for a series circuit of this type and the corresponding redundancy requirement are considered more closely, it emerges that, in the event of the failure of, or the functional disturbance in, a semiconductor module in the series circuit, the requirement is not to be imposed on said module that it must carry any arbitrary current in the required short circuit which is then present. Rather, it must exhibit normal on-state properties, up to the limit of the current occurring in the application, as long as the remaining semiconductor modules of the same series circuit are functioning. This on-state property need not necessarily be achieved by fusing of the silicon chip and corresponding through-connection of a presspack.

Rather, according to the invention, it may more simply be provided that, in the case of failure of a component of a semiconductor module (irrespective of whether it has changed into a conducting, partially conducting or blocking state), a further component—which is connected in parallel with said component—of the semiconductor module is switched on, with the result that it does not block the voltage that is applied to the parallel circuit but rather becomes conductive. The possibly undefined state of the first component is thus no longer important. The parallel circuit is thus put into a conducting state, with the result that only the switch-on voltage occurs at said parallel circuit. The remaining semiconductor modules then assume control of the high voltage on their own. Depending on the extent of redundancy in the semiconductor circuit arrangement according to the invention, the failure of a plurality of semiconductor modules may also be compensated for by the remaining semiconductor modules. It is merely necessary to satisfy the condition that, in total, the semiconductor modules which are still functioning have a dielectric strength that corresponds to the high voltage applied.

In the case of a semiconductor circuit arrangement for controlling a current of high current intensity, the object can be achieved according to the invention by each semiconductor module having a series circuit of at least two components, at least one first component of which can be conducting or blocking, during normal operation, for the voltage that is applied to it, by the remaining component(s) of the respective series circuit conducting, during normal operation, at least when the first component conducts, and by each semiconductor module being set up in such a manner that, in the event of a functional disturbance in the first component, the remaining component(s) permanently change(s) into a blocking state.

If, in a parallel circuit of semiconductor modules that is known from the prior art, one of said modules fails by changing into a permanently conducting state, the entire parallel circuit is conductively bridged and can no longer be used for the intended purpose of controlling a current.

As a result of the fact that each individual semiconductor module has a series circuit of components, it is possible, in the case of a functional disturbance in, or failure of, one of these components, to put another component of the series circuit into a blocking state, with the result that the entire series circuit and thus the corresponding semiconductor module are changed into a blocking state. In this state, the functioning of the circuit arrangement when controlling a current of high current intensity only depends on the remaining parallel-connected semiconductor modules. If appropriate redundancy is provided in said semiconductor modules, they may continue to conduct or block the current to be controlled. The semiconductor circuit arrangement may thus continue to be used reliably despite failure of a semiconductor module since the semiconductor module that has failed can be reliably put into a blocking state.

One advantageous refinement of the invention provides for a voltage sensor for measuring the voltage that is dropped to be provided at least for the first component.

If the semiconductor circuit arrangement comprises a series circuit of semiconductor modules for controlling a high voltage and each individual semiconductor module comprises a parallel circuit of components, it is expedient to measure the reverse voltage across at least one of the components, or else across all of the components, by means of a sensor and to process the measurement result in a control device. If the voltage measurement reveals a functional disturbance in a component of a semiconductor module, a further component of the same semiconductor module is put into a conducting state by the control device. This is particularly simple if the components are thyristors or IGBTs in which only one control input has to be correspondingly driven by the control device.

In the case of a semiconductor circuit arrangement for controlling a current of high current intensity with a plurality of parallel-connected semiconductor modules, each of which has a series circuit, provision may be made, for example, for the remaining components to be in the switched-on state during normal operation and for the partial current to be controlled merely by switching the first component on and off. In this case, when a functional disturbance in the first component is detected, at least one of the remaining components is put into a blocking (i.e. non-conducting) state in order to bring the entire semiconductor module into a blocking (i.e. non-conducting) state. This may likewise take place in a particularly simple manner, when the components are formed by thyristors or IGBTs, by a control device driving at least one of the remaining components in such a manner that it changes into a blocking state.

The functional disturbance is thus detected by means of a voltage sensor and at least one component is driven in a suitable manner in order to put the functionally disturbed semiconductor module either into a defined conducting state or into a defined blocking state.

A further advantageous refinement of the invention provides for a current sensor for measuring the current that is flowing through to be provided at least for the first component.

The control device can thus also detect, on the basis of a current measurement, the proper functioning of a component and can act accordingly.

A further advantageous refinement of the invention provides for a sensor for monitoring a control input to be provided at least for the first component.

A functional disturbance in one of the semiconductor components mentioned may involve, for example, a short circuit being produced between the control input and an emitter terminal, with the result that, unlike in the normal state, a high control current (gate current) flows. This is detrimental, on the one hand, to the control device that has to supply the high control current for which it is not normally designed. On the other hand, the functioning of the respective semiconductor module is disturbed. In any case, the sensor for monitoring a control input should emit a disturbance signal to the control device in order to change the semiconductor module into a defined conducting state or into a defined blocking state.

Provision may also advantageously be made for the lead of a control input to have a fuse and/or a current limiter. The invention may be implemented in a particularly simple manner by a fuse being formed by a bonding wire (which fuses when there is an overload) as the lead of the control input.

One particularly advantageous implementation of the invention results from the fact that at least two sensors from the following group of three sensors: voltage sensor, current sensor, sensor for monitoring a control input, are provided and that the control device processes the signals from these sensors in order to ascertain functional disturbances. In particular, by combining the signals from the different sensors, the control device can ascertain the presence of a functional disturbance in a very reliable manner and can drive the semiconductor circuit arrangement in a corresponding manner.

In addition, the invention relates to a semiconductor circuit arrangement, in which the control device checks disturbance-free functioning by means of at least one sensor in each semiconductor module and, in the event of a functional disturbance in a component, at least one other component of the same semiconductor module is driven in such a manner that the semiconductor module as a whole is changed either into a defined conducting state or a defined blocking state.

The invention is explained in more detail below with reference to the exemplary embodiments illustrated in the figures of the drawing, in which:

DESCRIPTION OF THE INVENTION

Figure 1A:
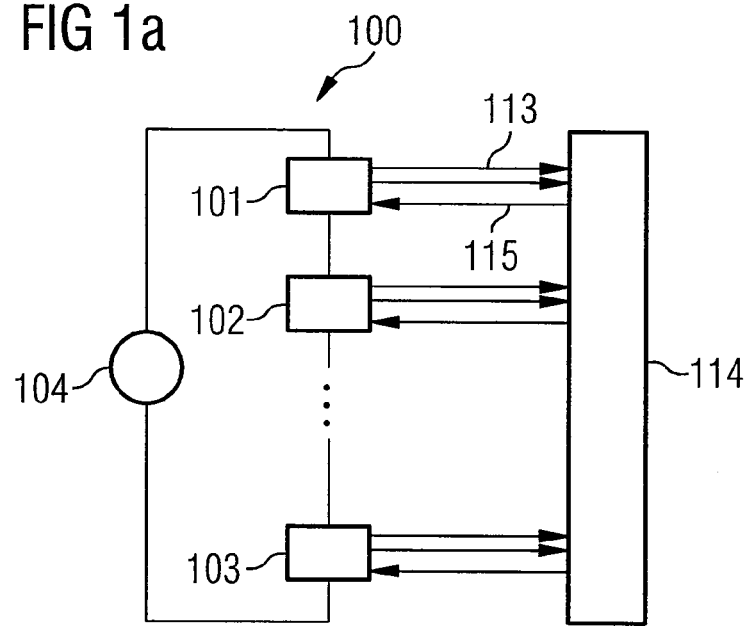
FIG. 1a shows a semiconductor circuit arrangement for controlling a high voltage with a series circuit of semiconductor modules.

The semiconductor circuit arrangement 100 in accordance with FIG. 1a exhibits a series circuit of semiconductor modules 101, 102, 103, a high voltage that is symbolized by the voltage source 104 being applied to said series circuit. Partial voltages of the voltage 104 are respectively applied to each of the semiconductor modules 101, 102, 103.

Figure 1B:
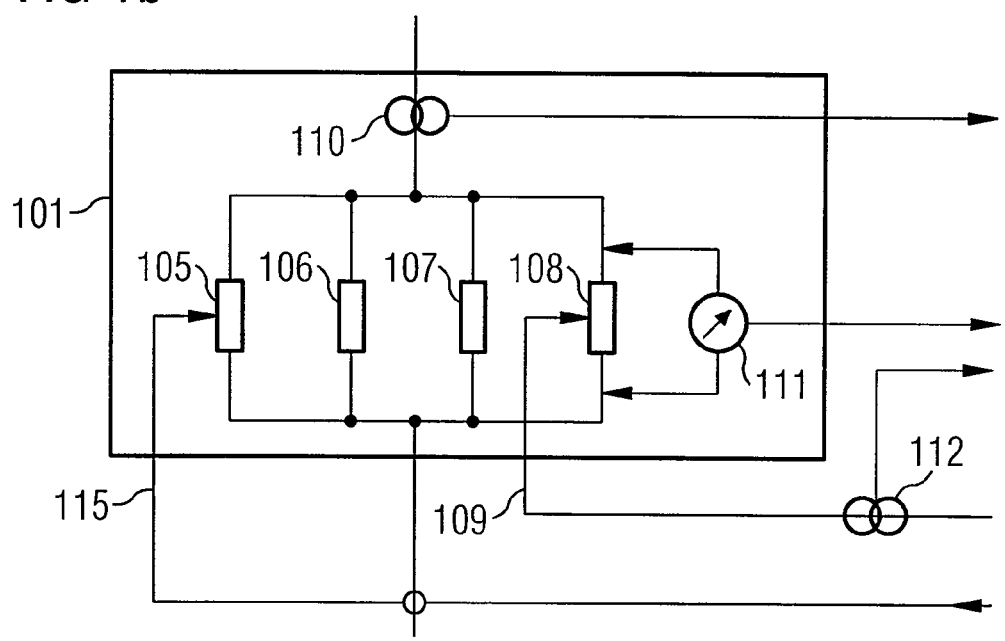
FIG. 1b shows a detailed view of a single one of the semiconductor modules from FIG. 1a, FIG. 2a shows a semiconductor circuit arrangement for controlling a current of high current intensity with a parallel circuit of semiconductor modules.

As FIG. 1b shows, each of the semiconductor modules 101, 102, 103 (of which only one, 101, is illustrated by way of example) comprises, inter alia, a parallel circuit of components 105, 106, 107, 108, each individual one of which can block or conduct the voltage applied to the semiconductor module 101. Each of the components has a control input, which is illustrated merely by way of example in the components 105, 108 by means of the lead 109, 115 and which is driven by a control device. During normal operation, the components 105, 106, 107, for example, may be permanently driven in a blocking manner and, depending on the requirements of the semiconductor circuit arrangement, the first component 108 may be correspondingly alternately driven in a conducting or blocking manner. Driving the component 108 thus determines whether the semiconductor module 101 is conducting or blocking. The remaining semiconductor modules are constructed correspondingly and are driven synchronously.

The functioning of the semiconductor module is monitored by means of a current sensor 110 and also a voltage sensor 111 and a sensor 112 in the lead 109 of the control input of the first component 108. One or more measurement variables of the current sensor 110, the voltage sensor 111 or the sensor 112 of the control input are, as illustrated diagrammatically by the arrows 113 in FIG. 1a, supplied to a control device 114.

The control device 114 checks whether each of the three monitored variables detected corresponds to disturbance-free functioning of the corresponding semiconductor module 101 or of the first component 108 that is driven in a variable manner.

If this is not the case, the control device 114 drives the remaining components 105, 106, 107 by means of the control inputs (of which one, 115, is illustrated by way of example) in such a manner that the remaining components permanently change into a conducting state, with the result that the entire semiconductor module 101 changes into a conducting state. From this point in time on, the remaining semiconductor modules 102, 103 and further semiconductor modules (not illustrated) in accordance with FIG. 1a assume control of the high voltage 104 on their own.

Figure 2A:
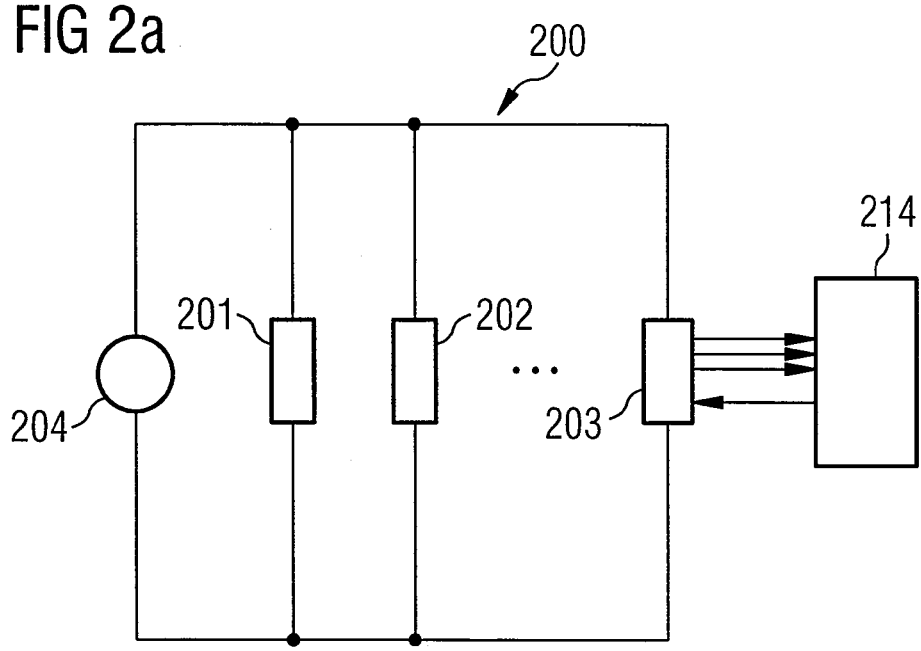
FIG. 2b shows a detailed view of a single one of the semiconductor modules from FIG. 2a, and FIG. 3 shows an illustration of a plurality of components which have been combined to form a semiconductor module in a single module housing.

A current of high current intensity that is symbolically represented by the current source 204 is intended to be controlled by means of the semiconductor circuit arrangement that is illustrated in FIG. 2a and has a parallel circuit 200 of semiconductor modules 201, 202, 203.

On account of the parallel circuit, each of the semiconductor modules 201, 202, 203 accepts a partial current.

Figure 2B:
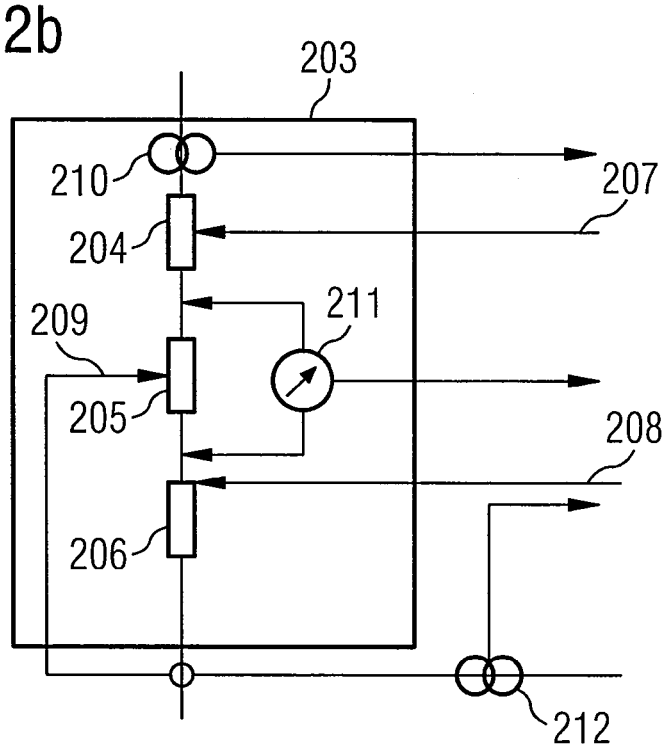

As illustrated in detail in FIG. 2b, each of the semiconductor modules 201, 202, 203 has, in its interior, a series circuit comprising a plurality of components 204, 205, 206.

The components 204, 206 are typically put permanently into the conducting state by means of control inputs 207, 208. The component 205 is respectively temporally controlled by means of the control input 209 in the manner required by the semiconductor circuit arrangement. The fact of whether the semiconductor module 203 as a whole is conducting or blocking thus depends on the respective state of the component 205.

The functioning of the component 205 is continuously monitored by the control device 214 by means of the current sensor 210, the voltage sensor 211 and the sensor 212 for the control input 209 or else only one of these sensors.

If the detected voltage, the current or the current detected in the control input 209 does not match the desired values, a functional disturbance in the component 205 is detected and, by driving the control inputs 207 and/or 208 of the components 204, 206, the control device 214 puts the corresponding components into a nonconducting state, with the result that the semiconductor module 203 as a whole is changed into a nonconducting state.

In this state, the remaining semiconductor modules 201, 202 and further semiconductor modules (not illustrated in FIG. 2a) assume control of the current on their own. In this manner, the semiconductor circuit arrangement remains functional despite the failure of a semiconductor module.

Like the control device 114, the control device 214 contains an evaluation logic unit, which, for example, combines the values which have been detected by the various sensors with one another or compares them with reference values in order to obtain a reliable statement on the functioning of the respective component that is being monitored.

Since, in the normal case, in each individual semiconductor module, approximately half of the heat produced comprises on-state losses and half comprises switching losses, the total amount of heat produced falls when the semiconductor modules are switched off since switching losses no longer occur. Correspondingly higher losses occur in the remaining semiconductor modules but these losses may be offset by a redundant design.

A plurality of disturbed semiconductor modules can thus also be shut down, if necessary, by the control device 114, 214 without the entire semiconductor circuit arrangement becoming non-functional.

In the simplest case, the control device 114, 214 is of extremely simple configuration and, in the event of a malfunction, only one simple flip-flop at the control inputs of the various components of a disturbed semiconductor module is set in such a manner that the semiconductor module is brought into a defined conducting or non-conducting state. It is recommended to satisfy the high requirements imposed on functional reliability by the control devices also being embodied in a redundant manner, that is to say by two control devices being operated in parallel with one another, for example.

Figure 3:
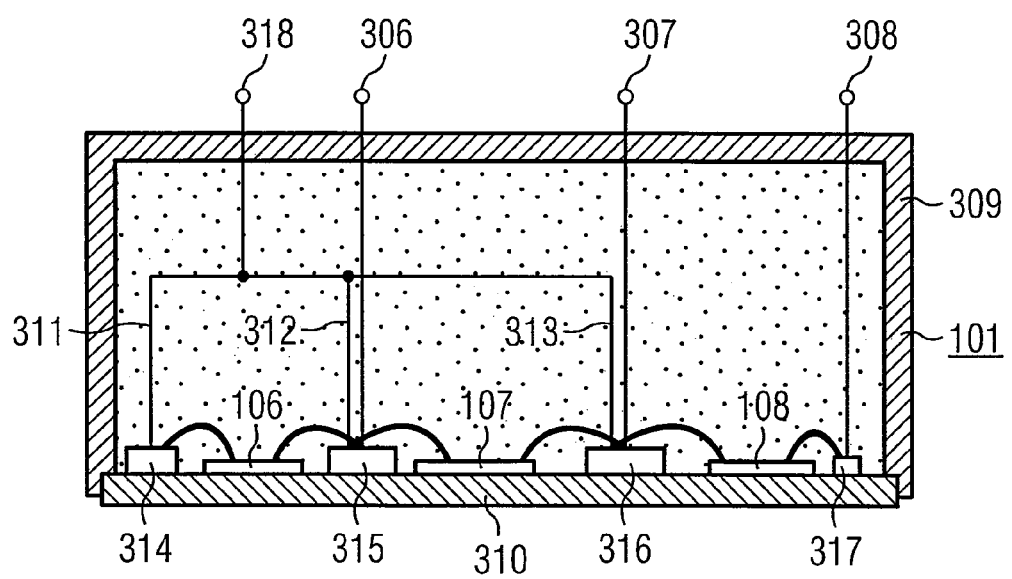

FIG. 3 shows a semiconductor module 101 in an integrated design having three semiconductor components 106, 107, 108 which are embodied as silicon chips without a separate housing. The three semiconductor components, for example IGBTs, are electrically connected in parallel. The three gate lines 306, 307, 308 are routed separately through the module housing 309 to the outside, with the result that each component can be driven individually. Provision may also be made for groups of components to be combined and to be respectively driven together, for example six groups of 4 components each, the gate lines of which are then routed to the outside together. The groups can then be controlled individually.

The chips may be soldered individually onto a carrier that simultaneously forms the thermal coupling to the cooling system and is used as a common collector 310. The emitter terminals 311, 312, 313 are advantageously routed together to a common terminal 318. For the purpose of electrically insulating the individual components, the interior of the module housing 309 is encapsulated, as far as possible without bubbles, with a silicone gel.

The gate and emitter lines in the module are collected either on conductively coated ceramic substrates or on printed circuit boards 314, 315, 316, 317 and are insulated from the bottom/carrier 310. In addition, these ceramic substrates or printed circuit boards 314, 315, 316, 317 form the carriers for corresponding wirings and group connections of the emitter and gate terminals and, if appropriate, carry bonding wires for contact-connecting the chips/semiconductor components. The terminals which are routed to the outside are also contact-connected there.

Since it has to have a coefficient of thermal expansion that is similar to that of the silicon chips 106, 107, 108, the carrier 310 is fabricated, for example, from Mo, AlSiC or CuSiC with a coating that can be soldered.

I claim:

1. A circuit, comprising:
    a series arrangement of semiconductor modules operable to control a high voltage, each semiconductor module including two or more components electrically coupled in parallel, at least one of the components included in each semiconductor module having a variable conducting or blocking normal operating state whereas the remaining components included in each semiconductor module have a fixed blocking normal operating state;
    one or more sensors operable to monitor the function of the semiconductor modules; and
    a control device operable to set the operating state of the semiconductor modules, detect a functional disturbance in one or more of the semiconductor modules based on the sensor output, and change the operating state of the semiconductor modules for which a functional disturbance is detected to a fixed conducting state so that only those semiconductor modules for which a functional disturbance is not detected assist in controlling the high voltage.

2. The circuit of claim 1, wherein the one or more sensors comprises a voltage sensor operable to sense the voltage dropped across one or more of the components included in each semiconductor module.

3. The circuit of claim 1, wherein the one or more sensors comprises a current sensor operable to sense the current flowing through one or more of the components included in each semiconductor module.

4. The circuit of claim 1, wherein the one or more sensors comprises a sensor operable to monitor a control input applied to one or more of the components included in each semiconductor module.

5. The circuit of claim 1, wherein the one or more sensors comprises at least two sensors selected from the group consisting of a voltage sensor, a current sensor and a control input sensor, and wherein the control device is operable to detect a functional disturbance in the semiconductor modules based on signals received from the sensors.

6. The circuit of claim 1, wherein the lead of a control input of one or more of the semiconductor modules has a fuse and/or current limiter.

7. The circuit of claim 6, wherein the current limiter comprises a bonding wire operable to fuse responsive to an overload.

8. The circuit of claim 1, wherein the components comprise thyristors.

9. The circuit of claim 1, wherein the components comprise IGBTs.

10. The circuit of claim 1, wherein the control device is operable to detect a functional disturbance in one of the components having a variable conducting or blocking normal operating state and in response, to change the operating state of the remaining components included in the same semiconductor module to a fixed conducting state.

11. A circuit, comprising:
    a parallel arrangement of semiconductor modules operable to control a high current, each semiconductor module including two or more components electrically coupled in series, at least one of the components included in each semiconductor module having a variable conducting or blocking normal operating state whereas the remaining components included in each semiconductor module have a fixed conducting normal operating state;

one or more sensors operable to monitor the function of the semiconductor modules; and a control device operable to set the operating state of the semiconductor modules, detect a functional disturbance in one or more of the semiconductor modules based on the sensor output, and change the operating state of the semiconductor modules for which a functional disturbance is detected to a fixed non-conducting state so that only those semiconductor modules for which a functional disturbance is not detected assist in controlling the high current.

12. The circuit of claim 11, wherein the one or more sensors comprises a voltage sensor operable to sense the voltage dropped across one or more of the components included in each semiconductor module.

13. The circuit of claim 11, wherein the one or more sensors comprises a current sensor operable to sense the current flowing through one or more of the components included in each semiconductor module.

14. The circuit of claim 11, wherein the one or more sensors comprises a sensor operable to monitor a control input applied to one or more of the components included in each semiconductor module.

15. The circuit of claim 11, wherein the one or more sensors comprises at least two sensors selected from the group consisting of a voltage sensor, a current sensor and a control input sensor, and wherein the control device is operable to detect a functional disturbance in the semiconductor modules based on signals received from the sensors.

16. The circuit of claim 11, wherein the lead of a control input of one or more of the semiconductor modules has a fuse and/or current limiter.

17. The circuit of claim 16, wherein the current limiter comprises a bonding wire operable to fuse responsive to an overload.

18. The circuit of claim 11, wherein the components comprise thyristors.

19. The circuit of claim 11, wherein the components comprise IGBTs.

20. The circuit of claim 11, wherein the control device is operable to detect a functional disturbance in one of the components having a variable conducting or blocking normal operating state and in response, to change the operating state of the remaining components included in the same semiconductor module to a fixed non-conducting state.

* * * * *